US012641944B2

(12) United States Patent
Ueta

(10) Patent No.: US 12,641,944 B2
(45) Date of Patent: May 26, 2026

(54) LIGHT-EMITTING ELEMENT AND LIGHT-EMITTING DEVICE

(71) Applicant: SHARP KABUSHIKI KAISHA, Sakai City (JP)

(72) Inventor: Yoshihiro Ueta, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 902 days.

(21) Appl. No.: 17/791,810

(22) PCT Filed: Jan. 15, 2020

(86) PCT No.: PCT/JP2020/001123
§ 371 (c)(1),
(2) Date: Jul. 8, 2022

(87) PCT Pub. No.: WO2021/144893
PCT Pub. Date: Jul. 22, 2021

(65) Prior Publication Data
US 2023/0090252 A1 Mar. 23, 2023

(51) Int. Cl.
*H10K 50/115* (2023.01)
*H10K 85/30* (2023.01)
*H10K 85/60* (2023.01)

(52) U.S. Cl.
CPC ........... *H10K 50/115* (2023.02); *H10K 85/30* (2023.02); *H10K 85/653* (2023.02); *H10K 85/655* (2023.02); *H10K 85/656* (2023.02); *H10K 85/657* (2023.02); *H10K 85/6574* (2023.02)

(58) Field of Classification Search
CPC ...... H10K 50/115; H10K 85/30; H10K 85/60; H10K 85/653; H10K 85/655; H10K 85/656; H10K 85/657; H10K 85/6574; H05B 33/14
USPC ............................................................ 257/40
See application file for complete search history.

(56) References Cited

U.S. PATENT DOCUMENTS

2012/0119200 A1* 5/2012 Ueno .................. C09K 11/671
257/E51.026
2021/0066631 A1* 3/2021 Choi ...................... H10K 71/12

FOREIGN PATENT DOCUMENTS

JP 2016-173888 A 9/2016
JP 2018-137281 A 8/2018

* cited by examiner

*Primary Examiner* — Jennifer D. Carruth
(74) *Attorney, Agent, or Firm* — ScienBiziP, P.C.

(57) ABSTRACT

A light-emitting element includes: a first electrode; a second electrode; and a light-emitting layer between the first electrode and the second electrode, wherein the light-emitting layer includes quantum dots and a cyclic organic compound, and at least some of atoms that form a ring of the cyclic organic compound are coordinated to the quantum dots.

7 Claims, 3 Drawing Sheets

LIGHT-EMITTING ELEMENT AND LIGHT-EMITTING DEVICE

TECHNICAL FIELD

The disclosure relates to light-emitting elements including a light-emitting layer containing quantum dots and also to light-emitting devices including such a light-emitting element.

BACKGROUND ART

Patent Literature 1 discloses a light-emitting device including a nanoparticulate fluorescent material including: quantum dots; and surface modification portions covering the surfaces of the quantum dots. The ligands coordinated to quantum dots, such as the surface modification portions described in Patent Literature 1, generally contribute to the improvement of dispersibility of the quantum dots in a medium and to the inactivation of defects in the surfaces of the quantum dots.

CITATION LIST

Patent Literature

Patent Literature 1: Japanese Unexamined Patent Application Publication, Tokukai, No. 2018-137281

SUMMARY OF INVENTION

Technical Problem

Known ligands, including the surface modification portions described in Patent Literature 1, generally tend to show low carrier transportability. Therefore, the injection efficiency of carriers to the quantum dots to which the known ligands are coordinated is reduced, disadvantageously resulting in a decrease in the luminous efficiency of the light-emitting layer containing the quantum dots or in a decrease in the reliability of the light-emitting layer.

Solution to Problem

To address these issues, the disclosure, in an aspect thereof, is directed to a light-emitting element including: a first electrode; a second electrode; and a light-emitting layer between the first electrode and the second electrode, wherein the light-emitting layer includes quantum dots and a cyclic organic compound, and at least some of atoms that form a ring of the cyclic organic compound are coordinated to the quantum dots.

To address these issues, the disclosure, in another aspect thereof, is directed to a light-emitting element including: a first electrode; a second electrode; and a light-emitting layer between the first electrode and the second electrode, wherein the light-emitting layer includes quantum dots and a cyclic organic compound, and the cyclic organic compound includes at least one or more species selected from the group consisting of crown ether, hetero crown ether, benzo-crown ether, cryptand, calixarene, and cyclofan.

To address these issues, the disclosure, in a further aspect thereof, is directed to a light-emitting element including: a first electrode; a second electrode; and a light-emitting layer between the first electrode and the second electrode, wherein the light-emitting layer includes quantum dots and a cyclic organic compound, the cyclic organic compound includes cyclic ether, and the cyclic ether has general formula (1).

[Chem. 1]

$$(-CH_2-CH_2\text{-}A\text{-})_n \quad (1)$$

where n is an integer from 2 to 8, both inclusive, and each A may be either identical to another A or different from another A and is any of an O, a NH, and a S.

Advantageous Effects of Invention

The disclosure, in an aspect thereof, improves the injection efficiency of carriers to quantum dots and also improves the luminous efficiency of the light-emitting layer or the reliability of the light-emitting layer, while the improved dispersibility of the quantum dots in a medium and maintaining of the inactivation of defects in the surface of the quantum dots.

DESCRIPTION OF EMBODIMENTS

Embodiments

Figure 1A:
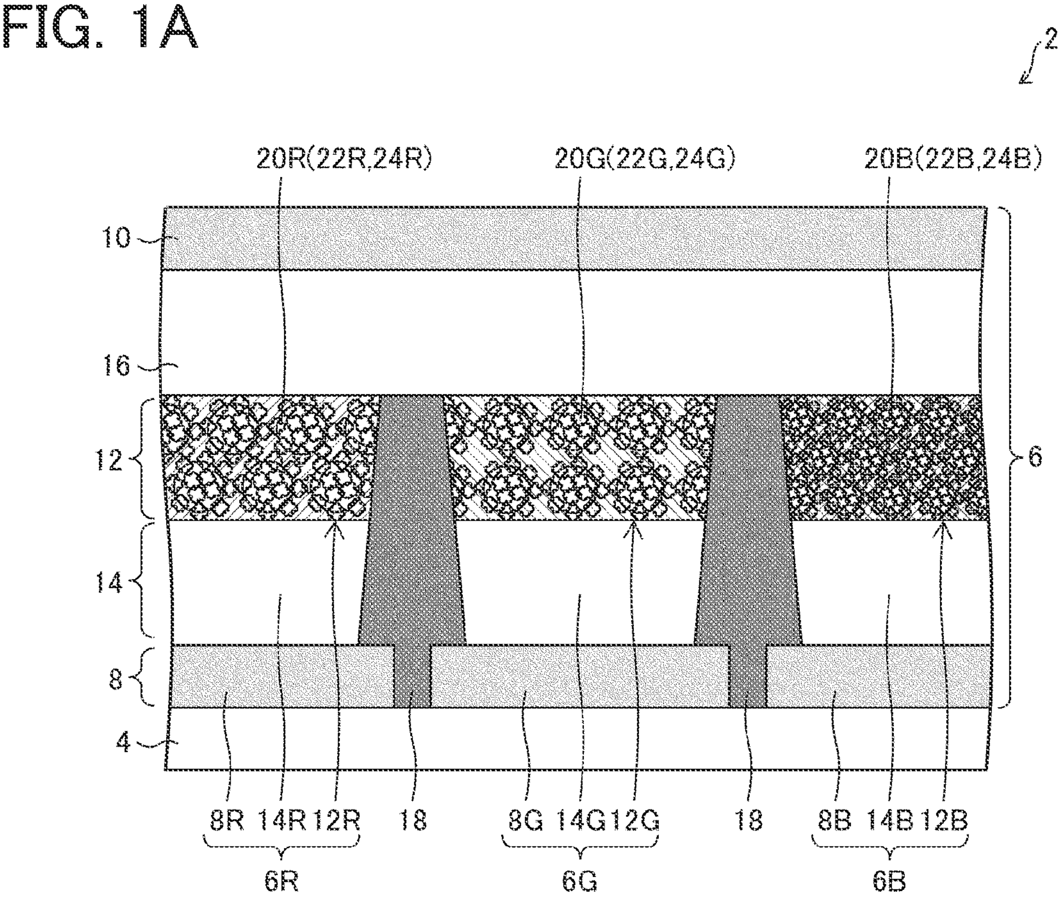
FIG. 1A is a schematic cross-sectional view of a display device in accordance with an embodiment of the disclosure.
Figure 1B:
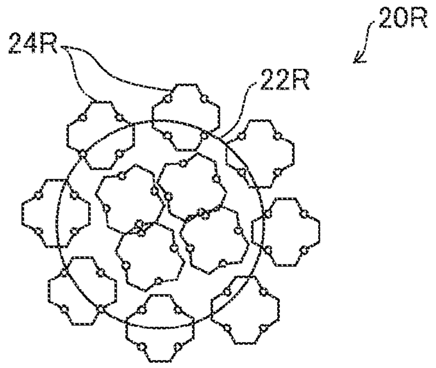
FIG. 1B is a schematic view of a red-quantum-dot luminous body.
Figure 2:
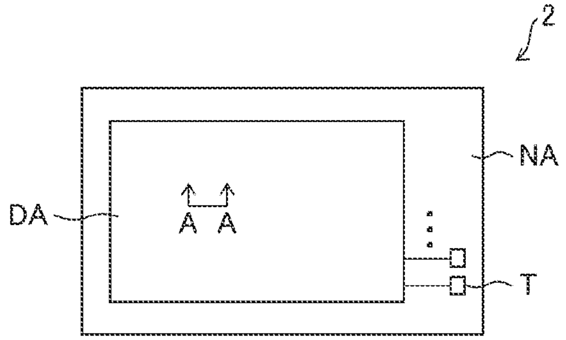
FIG. 2 is a schematic plan view of the display device in accordance with the embodiment of the disclosure.

FIG. 2 is a schematic plan view of a display device 2 in accordance with the present embodiment. FIG. 1A is a schematic cross-sectional view of the display device 2 in accordance with the present embodiment, FIG. 1.B is an enlarged schematic view of a red-quantum-dot luminous body 20R (which will be described later in detail). The schematic cross-sectional view of the display device 2 in FIG. 1A corresponds to the cross-sectional view, taken along line A-A, of the display device 2 shown in FIG. 2.

Referring to FIG. 2, the display device 2 in accordance with the present embodiment has: a light-emitting region DA through which emitted light is extracted; and a frame area NA surrounding the light-emitting region DA. The frame area NA may have formed therein terminals T to which signals are fed for driving the light-emitting elements in the display device 2 (described later in detail).

In a plan view, in a location overlapping the light-emitting region DA, as shown in the cross-sectional view of the display device 2 in FIG. 1A, the display device 2 in accordance with the present embodiment includes an array substrate 4 and a light-emitting diode 6 on this array substrate 4. In particular, the display device 2 has a structure in which a stack of various layers constituting the light-emitting diode 6 is formed on the array substrate 4 carrying TFTs (thin film transistors) (not shown) thereon. Note that throughout the present specification, the direction from the light-emitting diode 6 of the display device 2 toward the array substrate 4 is referred to as "downward," and the direction from the light-emitting diode 6 of the display device 2 toward the light-emitting face of the display device 2 is referred to as "upward."

The light-emitting diode 6 includes: a first electrode 8 on the array substrate 4; and a second electrode 10 opposite the first electrode 8 from the array substrate 4 and further includes a light-emitting layer 12 between the first electrode 8 and the second electrode 10. The light-emitting diode 6 further includes a first charge transport layer 14 between the first electrode 8 and the light-emitting layer 12 and a second charge transport layer 16 between the second electrode 10 and the light-emitting layer 12. Note that the display device 2 may include either a capping layer or a sealing layer containing a sealing material on the upper side of the second electrode 10.

The light-emitting diode 6, in the present embodiment, includes a light-emitting element 6R, a light-emitting element 6G, and a light-emitting element 6B. The light-emitting element 6R, the light-emitting element 6G, and the light-emitting element 6B are QLED elements including a semiconductor nanoparticle material (detailed later), in other words, quantum dots, in the light-emitting layer 12.

Here, the first electrode 8, the first charge transport layer 14, and the light-emitting layer 12 are separated from each other by an edge cover 18. Particularly, in the present embodiment, the first electrode 8 is separated by the edge cover 18 into a first electrode 8R for the light-emitting element 6R, a first electrode 8G for the light-emitting element 6G and a first electrode 8B for the light-emitting element 6B. The first charge transport layer 14 is also separated by the edge cover 18 into a first charge transport layer 14R for the light-emitting element 6R, a first charge transport layer 14G for the light-emitting element 6G, and a first charge transport layer 14B for the light-emitting element 6B. The light-emitting layer 12 is also separated by the edge cover 18 into a light-emitting layer 12R, a light-emitting layer 12G, and a light-emitting layer 12B.

Note that the second charge transport layer 16 and the second electrode 10 are not separated by the edge cover 18, but provided commonly to all the light-emitting elements.

The edge cover 18 may be disposed in a location covering the side faces of the first electrode 8 and the vicinity of the peripheral edge of the top face of the first electrode 8 as shown in the cross-sectional view of the display device 2 in FIG. 1A.

In the present embodiment, the light-emitting element 6R includes the first electrode 8R, the first charge transport layer 14R, the light-emitting layer 12R, the second charge transport layer 16, and the second electrode 10. In addition, the light-emitting element 6G includes the first electrode 8G, the first charge transport layer 14C the light-emitting layer 12G the second charge transport layer 16, and the second electrode 10. Additionally, the light-emitting element 6B includes the first electrode 8B, the first charge transport layer 14B, the light-emitting layer 12B, the second charge transport layer 16, and the second electrode 10.

The first electrode 8 and the second electrode 10 contain an electrically conductive material and are electrically connected respectively to the first charge transport layer 14 and the second charge transport layer 16. Either one of the first electrode 8 and the second electrode 10 that is closer to the light-emitting face of the display device 2 is a translucent electrode.

The first electrode 8 has a structure in which ITO (indium tin oxide) is stacked on, for example, a Ag—Pd—Cu alloy. The first electrode 8 having this structure is a reflective electrode that reflects the light emitted by the light-emitting layer 12. Therefore, the portion of the light emitted by the light-emitting layer 12 that travels downward is reflected by the first electrode 8.

In contrast, the second electrode 10 is composed of, for example, a translucent Mg—Ag alloy. In other words, the second electrode 10 is a light-transmissive electrode that transmits the light emitted by the light-emitting layer 12. Therefore, the portion of the light emitted by the light-emitting layer 12 that travels upward transmits through the second electrode 10. As described here, the display device 2 allows for upward discharging of the light emitted by the light-emitting layer 12.

As described above, the display device 2 can direct both the light emitted upward by the light-emitting layer 12 and the light emitted downward by the light-emitting layer 12 toward the second electrode 10 (upward). In other words, the display device 2 is structured as a top-emission display device.

Note that the above-described structures of the first electrode 8 and the second electrode 10 are mere examples, and the first electrode 8 and the second electrode 10 may have other structures. For instance, by providing a light-transmissive electrode as the first electrode 8 and a light-reflective electrode as the second electrode 10, the display device 2 may be structured as a bottom-emission display device where the light from each light-emitting element is extracted through gaps between pixel circuits on the array substrate 4.

As an example, the first electrode 8 is a cathode, and the second electrode 10 is an anode. Alternatively, the first electrode 8 may be an anode, in which case the second electrode 10 is a cathode.

In the present embodiment, the light-emitting layer 12 includes a quantum-dot luminous body. Specifically, in the present embodiment, the light-emitting layer 12R includes the red-quantum-dot luminous body 20R, the light-emitting layer 12G includes a green-quantum-dot luminous body 20G, and the light-emitting layer 12B includes a blue-quantum-dot luminous body 20B.

In the present embodiment, in each light-emitting body, through the recombination of electrons and holes, the red-quantum-dot luminous body 20R emits red light, the green-quantum-dot luminous body 20G emits green light, and the blue-quantum-dot luminous body 20B emits blue light. Therefore, the light-emitting layer 12R, the light-emitting layer 12G, and the light-emitting layer 12B emit red light, green light, and blue light respectively. In other words, the light-emitting element 6R, the light-emitting element 6G, and the light-emitting element 6B are light-emitting elements that emit red light, green light, and blue light respectively.

Here, blue light is light that has a central emission wavelength in the wavelength range of, for example, from 400 nm to 500 nm, both inclusive. In addition, green light is light that has a central emission wavelength in the wavelength range of, for example, from in excess of 500 nm to 600 nm inclusive. Additionally, red light is light that has a central emission wavelength in the wavelength range of, for example, from in excess of 600 nm to 780 nm inclusive.

The display device 2 in accordance with the present embodiment may include any one of the light-emitting element 6R, the light-emitting element 6G, and the light-emitting element 6B in each subpixel. Specifically, the display device 2 may include a plurality of red subpixels including the light-emitting element 6R, a plurality of green subpixels including the light-emitting element 6G, and a plurality of blue subpixels including the light-emitting element 6B. Thus, the display device 2 in accordance with the present embodiment is structured as a color display-enabled display device.

However, in the present embodiment, the display device 2 does not necessarily have the above-described structure. For instance, the display device 2 may include at least one light-emitting element 6R, at least one light-emitting element 6G, and at least one light-emitting element 6B. For instance, the display device 2 may include a plurality of light-emitting elements 6R, light-emitting elements 6G, or light-emitting elements 6B. In such a case, the display device 2 in accordance with the present embodiment is structured as a display device capable of monotonous display. Alternatively, the display device 2 may include one light-emitting element 6R, one light-emitting element 6G, and one light-emitting element 6B. In such a case, the display device 2 in accordance with the present embodiment is structured as a light-emitting device including, for example, illumination.

The light-emitting layer 12 may be a stack of light-emitting layers. Here, the quantum-dot light-emitting bodies in the light-emitting layer 12 are not necessarily arranged regularly as shown in the cross-sectional view of the display device 2 in FIG. 1A and may be contained in a disordered manner in the light-emitting layer 12. The light-emitting layer 12 preferably has a thickness of 2 to 100 nm.

The light-emitting layer 12 may be formed by a known, publicly known technique and as an example, may be formed by spin-coating with a solution containing quantum dots. In such a case, the solution containing a material for the light-emitting layer 12 may be cured by thermal processing at approximately 100° C. As other alternatives, the light-emitting layer 12 may be formed by vapor deposition using a vapor deposition mask, by coating with different materials by means of, for example, inkjet technology, or by patterning by means of photolithography.

The first charge transport layer 14 is a layer for transporting electric charges from the first electrode 8 to the light-emitting layer 12. The first charge transport layer 14 may have a function of disrupting the transport of electric charges from the second electrode 10. The second charge transport layer 16 is a layer for transporting electric charges from the second electrode 10 to the light-emitting layer 12. The second charge transport layer 16 may have a function of disrupting the transport of electric charges from the first electrode 8.

The first charge transport layer 14 and the second charge transport layer 16 may be formed by a known, publicly known technique and as an example, may be formed by, for example, sputtering or spin-coating. The first charge transport layer 14 and the second charge transport layer 16 may contain a known, publicly known charge transport material and may contain an inorganic or organic charge transport material including, for example, NiO, $TiO_2$, $WO_3$, $MoO_3$, TFB, PEDOT-PSS, or PVK.

When the first electrode 8 is a cathode, the first charge transport layer 14 may be an electron transport layer containing an electron transporting material. In such a case, the light-emitting diode 6 may include a hole injection layer (not shown) between the first electrode 8 and the first charge transport layer 14. When the second electrode 10 is an anode, the second charge transport layer 16 may be a hole transport layer containing a hole transporting material. In such a case, the light-emitting diode 6 may include an electron injection layer (not shown) between the second electrode 10 and the second charge transport layer 16.

A detailed description is now given of the structure of the quantum-dot light-emitting bodies in each light-emitting layer 12, by taking the red-quantum-dot luminous body 20R as an example. As shown in the enlarged schematic view of the red-quantum-dot luminous body 20R in FIG. 1B, the red-quantum-dot luminous body 20R includes a red quantum dot 22R that emits red light and a plurality of cyclic organic compounds 24R coordinated to the red quantum dot 22R. In addition, the green-quantum-dot luminous body 20G (no enlarged schematic view included), similarly to the red-quantum-dot luminous body 20R, includes a green quantum dot 22G that emits green light and a plurality of cyclic organic compounds 24G coordinated to the green quantum dot 22G. Furthermore, the blue-quantum-dot luminous body 20B (no enlarged schematic view included), similarly to the red-quantum-dot luminous body 20R, includes a blue quantum dot 22B that emits blue light and a plurality of cyclic organic compounds 24B coordinated to the blue quantum dot 22B.

The quantum dot in accordance with the present embodiment that includes the red quantum dot 22R is a light-emitting material that has a valence band energy level and a conduction band energy level and that emits red light through the recombination of holes in the valence band energy level and electrons in the conduction band energy level. Since the emission by quantum dots generally has a narrow spectrum due to the quantum confinement effect, it is possible obtain red light with a relatively deep chromaticity.

With a view to improving the external quantum efficiency of each light-emitting element, the quantum dot in accordance with the present embodiment preferably has, for example, a core/shell structure that includes a core and a shell around the core. The quantum dot in accordance with the present embodiment may have, for example, a core of a II-VI compound or a III-V compound and a shell of a II-VI compound or a II-V compound around the core.

The quantum dot in accordance with the present embodiment has a particle diameter of approximately 2 to 20 nm. Note that the wavelength of the emission by the quantum dot in accordance with the present embodiment is controllable through the particle diameter of the quantum dot. Therefore, the wavelength of the light emitted by each light-emitting element included in the light-emitting diode 6 can be controlled by controlling the particle diameters of the quantum dots included in each light-emitting layer 12.

In the present embodiment, the plurality of cyclic organic compounds 24R is coordinately bonded to the outermost layer of the red quantum dot 22R. Specifically, at least some of the atoms that form the ring of the cyclic organic compounds 24R are coordinated to the red quantum dot 22R. The cyclic organic compounds 24R are, for example, a cyclic ether of general formula (1) below.

[Chem. 1]

$$(\text{—}CH_2\text{—}CH_2\text{-}A\text{-})_n \qquad (1)$$

Note that in general formula (1) above, n is an integer from 2 to 8, both inclusive, and each A may be either identical to another A or different from another A and is any of an O, a NH, and a S.

Note that in the present specification, the "atoms that form the ring of a cyclic organic compound" refers to the atoms directly involved in the formation of the ring portion of the cyclic organic compound and does not include the atoms that are bound to these atoms and that are not a part of the ring. For instance, in general formula (1) above, the carbon atom and atom A are the "atoms that form the ring of the cyclic organic compound," and no hydrogen atoms are included in the "atoms that form the ring of the cyclic organic compound."

As an example, the cyclic organic compound 24R may be 12-crown-4 of the chemical formula below obtained when n is equal to 4, and A's are all O's in general formula (1) above.

[Chem. 2]

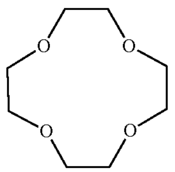

In addition, the cyclic organic compound 24R may be 15-crown-5 of the chemical formula below obtained when n is equal to 5, and A's are all O's in general formula (1) above.

[Chem. 3]

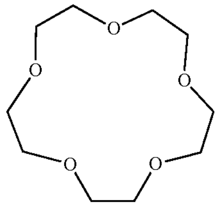

The cyclic organic compound 24R may be a hetero crown ether. In other words, the cyclic organic compound 24R may be a crown ether with at least one of the O's therein being replaced by, for example, a NH or a S. As an example, the cyclic organic compound 24R may be, among hetero crown ethers, diaza-18-crown-6 of the chemical formula below obtained when n is equal to 6, four of the A's are O's, and two of the A's are NH's in general formula (1) above.

[Chem. 4]

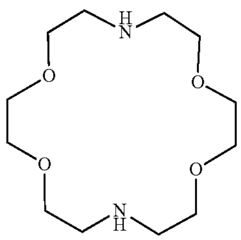

Additionally, the cyclic organic compound 24R may be, among hetero crown ethers, a thiacrown ether, including 1,4,8,11-tetrathiacyclotetradecane, of the chemical formula below.

[Chem. 5]

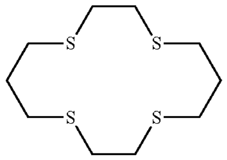

The cyclic organic compound 24R may be a benzo-crown ether. In other words, the cyclic organic compound 24R may be the compound of general formula (1) above with at least one of the $CH_2$—$CH_2$— structures therein being replaced by a benzene ring. As an example, the cyclic organic compound 24R may be dibenzo-18-crown-6 of the chemical formula below.

[Chem. 6]

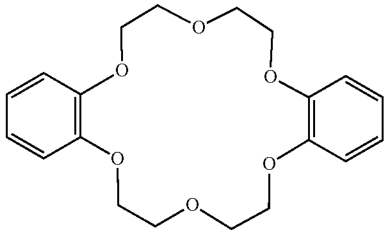

The cyclic organic compound 24R may be a cryptand. In other words, the cyclic organic compound 24R may have a polycyclic structure having two or more rings and obtained by substituting an N for an O in a crown ether in a symmetric manner. As an example, the cyclic organic compound 24R may be a [2.2.2] cryptand of chemical formula below.

[Chem. 7]

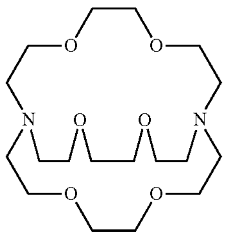

The cyclic organic compound 24R may be, beside cyclic ethers, a cyclofan formed by crosslinking a benzene-containing, aromatic cyclic organic compound with, for example, carbon.

As an example, the cyclic organic compound 24R may be, among cyclofans, [n] metacyclofan of the chemical formula below.

[Chem. 8]

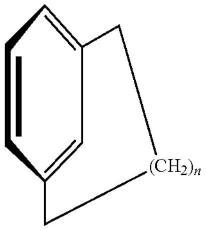

In addition, the cyclic organic compound 24R may be, among cyclofans, [n] paracyclofan of the chemical formula below.

[Chem. 9]

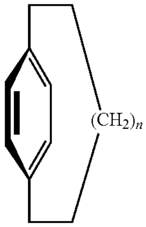

Additionally, the cyclic organic compound 24R may be, among cyclofans, [n,n'] paracyclofan of the chemical formula below.

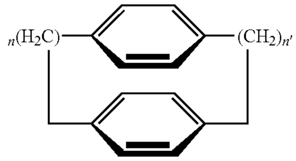

Alternatively, the cyclic organic compound 24R may be a calixarene that has a three-dimensional cyclic structure in which, for example, a plurality of phenols is bound via methylene groups. As an example, the cyclic organic compound 24R may be, among calixarenes, calix[4]arene of the chemical formula below.

[Chem. 11]

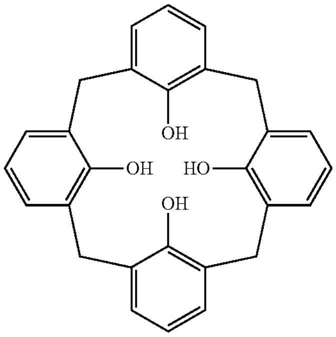

When the cyclic organic compound 24R is a calixarene, the red quantum dot 22R may be coordinately bonded to at least one of the hydroxy groups present inside the cyclic structure of the cyclic organic compound 24R.

Note that the cyclic organic compound 24R contained in the light-emitting layer 12R needs only to contain at least one species of the group including the above-described compounds. In other words, the cyclic organic compound 24R may include a plurality of species from the above-described compounds.

The red-quantum-dot luminous body 20R may be formed by coating with a solution in which the red quantum dots 22R and the cyclic organic compounds 24R are dispersed.

Figure 3:
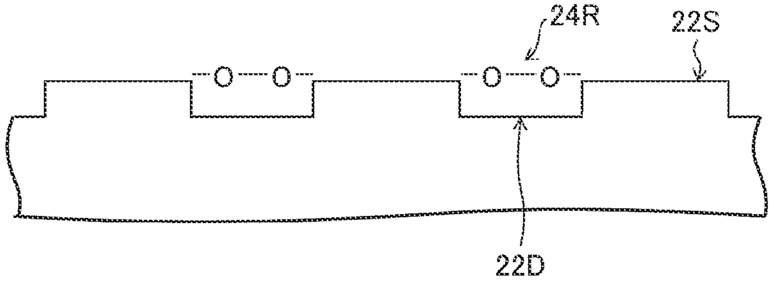
FIG. 3 is a schematic cross-sectional view of an outermost surface of a red-quantum-dot luminous body in accordance with an embodiment of the disclosure.

A detailed description is now given of the mechanism by which the cyclic organic compounds 24R are coordinated to the red quantum dot 22R, with reference to FIG. 3. FIG. 3 is an enlarged cross-sectional view of an outermost surface 22S of the red quantum dot 22R.

Referring to FIG. 3, the outermost surface 22S of the red quantum dot 22R could develop an atomic defect 22D. The atomic defect 22D forms as a dent or a pore in the outermost surface 22S. Here, inside the atomic defect 22D, an electric field is generated by the unshared electron pairs of the atoms surrounding the atomic defect 22D.

Meanwhile, every cyclic organic compound 24R, including the above-described compound, has a different n-electron concentration from one atom in the ring to another. For instance, in a crown ether, the O's among the atoms that form the ring have an unshared electron pair inside the ring. Therefore, an electric field is generated also inside the ring of the cyclic organic compound 24R.

Thus, for example, in a solution in which the red quantum dots 22R and the cyclic organic compounds 24R are dispersed, between the atomic defect 22D and at least one of the atoms that form the ring of the cyclic organic compound 24R, an attractive force is exerted by the electric field generated by each unshared electron pair. Here, if the atomic defect 22D and the ring of the cyclic organic compound 24R have sufficiently similar dimensions, the cyclic organic compound 24R is coordinated to the outermost surface 22S such that the cyclic organic compound 24R covers the atomic defect 22D, as shown in FIG. 3. Accordingly, the cyclic organic compound 24R is coordinated to the red quantum dot 22R.

The cyclic structure of the cyclic organic compound 24R coordinated to the red quantum dot 22R includes n-electrons. These n-electrons typically impart good dispersibility to the red quantum dot 22R in a non-polar medium containing, for example, an organic solvent for dispersing quantum dots.

Additionally, the cyclic organic compounds 24R coordinated to the red quantum dot 22R inactivate the atomic defect 22D of the red quantum dot 22R, thereby restraining the inactivation process caused by the recombination of carriers in the atomic defect 22D.

From the description above, the cyclic organic compounds 24R coordinated to the red quantum dot 22R have similar functions as the ligands coordinated to the known quantum dot, such as the ligands with a linear alkyl chain. In addition, since the cyclic organic compounds 24R have no hydroxy groups outside the ring, the cyclic organic compounds 24R are not dispersible in a polar medium such as water. It is preferable that the light-emitting layer 12 contains no polar medium such as water with a view to ensuring the long-term reliability of the light-emitting diode 6. Therefore, it is highly preferable that the red quantum dot 22R to which the cyclic organic compounds 24R are coordinated is not dispersible in polar molecules.

The number of the cyclic organic compounds 24R coordinated to each red quantum dot 22R may be on the order of from a few hundreds to a dozen hundreds.

Figure 4A:
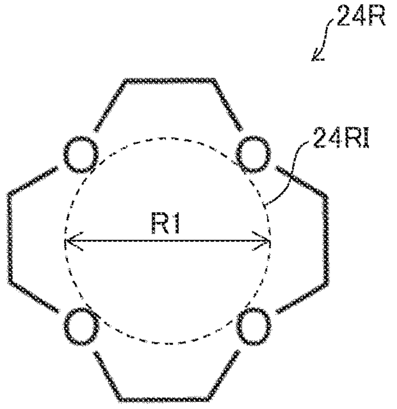
FIG. 4A and FIG. 4B are a schematic view illustrating the diameter of a ring of a cyclic organic compound in accordance with an embodiment of the disclosure.
Figure 4B:
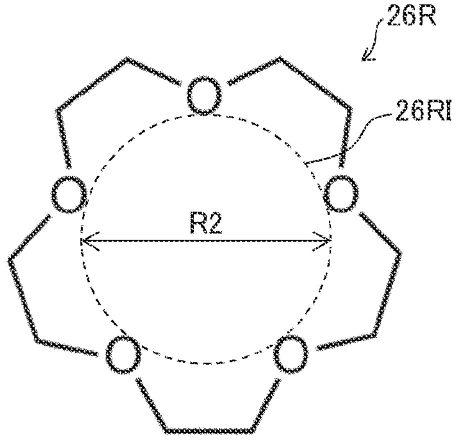

A detailed description is now given of the diameter of the ring of the cyclic organic compound coordinated to a quantum dot in accordance with the present embodiment with reference to FIG. 4A and FIG. 4B. FIG. 4A and FIG. 4B are an enlarged schematic view of the cyclic organic compound 24R and an enlarged schematic view of another cyclic organic compound 26R that has a different ring diameter than the cyclic organic compound 24R. FIG. 4A and FIG. 4B show an example where the cyclic organic compound 24R is 12-crown-4 and the cyclic organic compound 26R is 15-crown-5.

Referring to FIG. 4A and FIG. 4B, an incircle 24RI to the ring of the cyclic organic compound 24R has a diameter R1, whereas an incircle 26RI to the ring of the cyclic organic compound 26R has a diameter R2. In particular, R2 is longer than R1 because the cyclic organic compound 26R contains more atoms in the ring thereof than the cyclic organic compound 24R.

Here, when the cyclic organic compound is a crown ether, the ring of the cyclic organic compound can be assumed to be a regular polygon with each side being a $CH_2$—$CH_2$—O structure. The diameter R (pm) of the incircle of a regular n-gon with sides each A (pm) long is given by $R=A/\tan(\pi/n)$. Accordingly, since the $CH_2$—$CH_2$—O structure has a length of 167 pm, the diameter of the incircle of a crown ether with a ring that has a regular n-gon structure is given by $167/\tan(\pi/n)$ pm.

In the current context, the cyclic organic compound 24R is 12-crown-4 and has a square ring structure. Therefore, by plugging n=4 into the above formula, the diameter R1 is calculated as being equal to 167 pm. Incidentally, this diameter R1 is approximately equal to the ionic diameter of the elements in the second period of the periodic table. In particular, all the elements in the second period of the periodic table have the same closed-shell structure and therefore do not vary much in ionic diameter.

Hence, for example, when the atomic defect 22D of an element in the second period of the periodic table exists in the outermost surface 22S of the red quantum dot 22R, the cyclic organic compound 24R where the incircle 24RI has the diameter R1 will particularly likely be coordinated to the red quantum dot 22R.

In particular, for example, when the red quantum dot 22R contains a II-V compound in the outermost layer thereof, and the atomic defect 22D of a Group V element in that II-V compound exists, the cyclic organic compound 24R is efficiently coordinated to the atomic defect 22D. Specifically, for example, when the red quantum dot 22R contains ZnO in the outermost layer thereof, the cyclic organic compound 24R can be especially efficiently coordinated to the atomic defect 22D of the oxygen in the outermost surface 22S of the red quantum dot 22R.

Next, the cyclic organic compound 26R is 15-crown-5 and has a regular pentagonal ring structure. Therefore, by plugging n=5 into the above formula, the diameter R2 is calculated as being approximately equal to 230 pm. Incidentally, this diameter R2 is approximately equal to the ionic diameter of the elements in the third period of the periodic table.

Hence, for example, when the atomic defect 22D of an element in the third period of the periodic table exists in the outermost surface 22S of the red quantum dot 22R, the cyclic organic compound 26R where the incircle 26RI has the diameter R2 will particularly likely be coordinated to the red quantum dot 22R.

In particular, for example, when the red quantum dot 22R contains a II-VI compound in the outermost layer thereof, and the atomic defect 22D of a Group VI element in that II-VI compound exists, the cyclic organic compound 26R is efficiently coordinated to the atomic defect 22D. Specifically, for example, when the red quantum dot 22R contains ZnS in the outermost layer thereof, the cyclic organic compound 26R can be especially efficiently coordinated to the atomic defect 22D of the sulfur in the outermost surface 22S of the red quantum dot 22R.

The structure of the red-quantum-dot luminous body 20R containing the cyclic organic compounds 24R coordinated to the red quantum dot 22R has been discussed with reference to FIGS. 1, 3, and 4. Here, the green-quantum-dot luminous body 20G and the blue-quantum-dot luminous body 20B may have the same structure as the red-quantum-dot luminous body 20R, except for the particle diameter of the quantum dots and the color of the light emitted by the quantum dots.

Generally, the color of the light emitted by a quantum dot varies depending on the particle diameter of the quantum dot; the smaller the particle diameter of the quantum dot, the shorter the wavelength of the light emitted by the quantum dot. Therefore, the particle diameter of the quantum dots in the green-quantum-dot luminous body 20G is longer than the particle diameter of the red quantum dot 22R. In addition, the particle diameter of the quantum dots in the blue-quantum-dot luminous body 20B is even longer than the particle diameter of the quantum dots in the green-quantum-dot luminous body 20G.

Note that the red-quantum-dot luminous body 20R, the green-quantum-dot luminous body 20G, and the blue-quantum-dot luminous body 20B all contain quantum dots of a core/shell type, the color of the light emitted by each quantum dot may be changed by changing the particle diameter of the core. In such a case, the thicknesses of the core and shell may be adjusted in a suitable manner between the red-quantum-dot luminous body 20R, the green-quantum-dot luminous body 20G, and the blue-quantum-dot luminous body 20B, to render the general particle diameter of the quantum dots substantially constant.

The cyclic organic compounds coordinated to the quantum dots may be the same or mutually differ in the red-quantum-dot luminous body 20R, the green-quantum-dot luminous body 20G, and the blue-quantum-dot luminous body 20B, provided that the cyclic organic compounds include the above-described cyclic organic compound.

The light-emitting element 6R, the light-emitting element 6G, and the light-emitting element 6B in the display device 2 in accordance with the present embodiment each include, in the light-emitting layer 12, light-emitting bodies including quantum dots and cyclic organic compounds. In particular, in the present embodiment, at least one of the atoms that form the ring of the cyclic organic compound is coordinated to the quantum dots in the light-emitting layer 12. Accordingly, the cyclic organic compounds in the light-emitting layer 12 function as known ligands with a linear alkyl chain coordinated to the quantum dot.

Here, there occurs stacking interaction between the cyclic organic compounds coordinated to the quantum dots due to the π-electrons of the cyclic organic compounds. This stacking interaction assists the transport of electric charges around the quantum dots. Therefore, electric charges are efficiently injected to the quantum dots to which the cyclic organic compounds are coordinated in comparison to the quantum dots to which known ligands for transporting electric charge by hopping are coordinated. In addition, since the cyclic organic compounds have no hydroxy groups, the electric charges injected to quantum dots will unlikely accumulate in the cyclic organic compounds.

Hence, electric charges are more efficiently injected to the quantum dots in accordance with the present embodiment to which the cyclic organic compounds are coordinated than to the quantum dots to which known ligands are coordinated. Therefore, the recombination of electric charges by the quantum dots efficiently occurs in each of the light-emitting element 6R, the light-emitting element 6G, and the light-emitting element 6B that include, as light-emitting bodies, the quantum dots in accordance with the present embodiment to which the cyclic organic compounds are coordinated. Additionally, since electric charge are more readily injected to the quantum dots of each light-emitting element, the threshold voltage and resistance of the light-emitting element are decreased, and the charge-carrier balance is improved. Therefore, luminous efficiency is improved in the light-emitting element 6R, the light-emitting element 6G, and the light-emitting element 6B in accordance with the present embodiment.

Furthermore, the retention of electric charges in the light-emitting layer 12 in each of the light-emitting element 6R, the light-emitting element 6G, and the light-emitting element 6B will unlikely occur, and the recombination of electric charges that does not contribute to the emission of light, including an inactivation process such as an Auger process, will unlikely occur. Therefore, each layer suffers less damage induced by an inactivation process, which improves the reliability of the light-emitting element 6R, the light-emitting element 6G, and the light-emitting element 6B.

Thus, the cyclic organic compounds in accordance with the present embodiment coordinated to quantum dots achieve the same functions as known ligands and advantageously improve the luminous efficiency and reliability of each light-emitting element.

Note that in the present embodiment, not all the cyclic organic compounds in the light-emitting layer 12 are necessarily coordinated to the quantum dots. In other words, the light-emitting layer 12 may include cyclic organic compounds that are not coordinated to quantum dots. The cyclic organic compounds that are not coordinated to quantum dots can also advantageously improve the electric-charge transport efficiency owing to the stacking interaction of the cyclic organic compounds.

In the present embodiment, the cyclic organic compound preferably contains 8 to 16 carbon atoms. The smallest crown ether among unsubstituted crown ethers that is suited to the cyclic organic compound in accordance with the present embodiment is $C_8$ 12-crown-4. In addition, by the cyclic organic compound containing 16 or fewer carbon atoms, the diameter of the ring of the cyclic organic compound can be reduced to some extent, so that the cyclic organic compound can be more efficiently coordinated to the defects of the atoms generally used as a material for the shell of a quantum dot. Additionally, by the cyclic organic compound containing 16 or fewer carbon atoms, the strength of the electric field involved in the coordinate bonds of the cyclic organic compound can be maintained, and the structure stability of the cyclic organic compound itself can be ensured.

The light-emitting layer 12 in accordance with the present embodiment preferably contains the cyclic organic compounds in an amount of from 1 wt % to 50 wt %, both inclusive, and more preferably contains the cyclic organic compounds in an amount of from 5 wt % to 25 wt %, both inclusive. By the light-emitting layer 12 containing at least some amount of the cyclic organic compounds, the number of times of coating with the material for the light-emitting layer 12 to form the light-emitting layer 12 can be reduced. In addition, by the light-emitting layer 12 restraining the cyclic organic compounds to a somewhat low concentration, low viscosity can be achieved that is advantageous to the formation of the light-emitting layer 12 by means of coating.

Here, generally, when fluorescent particles such as quantum dots are located close to each other, excitation energy is transferred between the fluorescent particles by FRET (fluorescence resonance energy transfer) through electronic resonance. FRET includes, for example, fluorescence resonance energy transfer or Forster resonance energy transfer. Such energy transfer leads to the occurrence of an inactivation process in the fluorescent particles and as a result reduces the luminous efficiency of the fluorescent particles.

It is commonly known that the FRET efficiency, in other words, the likelihood of the excitation energy transfer described above, is inversely proportional to the particle-to-particle distance raised to the sixth power. The FRET efficiency is therefore sensitive to the particle-to-particle distance; the luminous efficiency of the fluorescent particles rapidly decreases as the fluorescent particles move toward each other Therefore, maintaining a proper distance between closely located quantum dots in the quantum-dot light-emitting layer is very important with a view to improving the luminous efficiency of the quantum dots.

Meanwhile, not all the cyclic organic compounds in the light-emitting layer 12 in accordance with the present embodiment are coordinated to the quantum dots, and some of the cyclic organic compounds are present between adjacent quantum dots. Therefore, these cyclic organic compounds, including the cyclic organic compounds coordinated to the quantum dots, have a function of separating adjacent quantum dots at a certain distance from each other.

Therefore, when the cyclic organic compounds account for from 5 wt % to 25 wt %, both inclusive, of the light-emitting layer 12, the distance between adjacent quantum dots can be properly maintained in a range where the cyclic organic compounds can restrain the adverse effects of FRET. Therefore, it is also preferable with a view to maintaining a high quantum efficiency of the light-emitting layer 12 that the light-emitting layer 12 in accordance with the present embodiment contains 5 wt % to 25 wt % cyclic organic compound.

In the present embodiment, depending on the type of the quantum dot contained in each light-emitting layer 12, the species of the cyclic organic compounds coordinated to that quantum dot may differ from each other. In particular, in the present embodiment, it is preferable that the shorter the wavelength of the light emitted by a quantum dot in the light-emitting layer 12, the fewer the atoms that form the ring of the cyclic organic compound coordinated to the quantum dot. In other words, when the display device 2 (light-emitting device) includes a first light-emitting element and a second light-emitting element that differs from the first light-emitting element, the first light-emitting element includes a first light-emitting layer containing first quantum dots, and the second light-emitting element includes a second light-emitting layer that has a shorter emission wavelength than the emission wavelength of the first quantum dots, the ring is preferably formed by fewer atoms in second cyclic organic compounds in the second light-emitting layer than in first cyclic organic compounds in the first light-emitting layer.

For instance, in FIG. 1A, when the first light-emitting element refers to the light-emitting element 6R including the light-emitting layer 12R containing the red quantum dots 22R (first quantum dots), the second light-emitting element refers to either the light-emitting element 6G including the light-emitting layer 12G (second light-emitting layer) containing the green quantum dots 22G (second quantum dots that have a shorter emission wavelength than the first quantum dots) or the light-emitting element 6B including the light-emitting layer 12B (second light-emitting layer) containing the blue quantum dots 22B (second quantum dots that have a shorter emission wavelength than the first quantum dots).

In addition, in FIG. 1A, when the first light-emitting element refers to the light-emitting element 6G including the light-emitting layer 12G (second light-emitting layer) containing the green quantum dots 22G (first quantum dots), the second light-emitting element refers to the light-emitting element 6B including the light-emitting layer 12B (second light-emitting layer) containing a blue-quantum-dot 22B (second quantum dots that have a shorter emission wavelength than the first quantum dots).

Here, the ring is preferably formed by fewer atoms in the cyclic organic compound 24G and the cyclic organic compound 24B (second cyclic organic compounds) coordinated respectively to the green quantum dot 22G and the blue quantum dot 22B (second quantum dot) than in the cyclic organic compound 24R (first cyclic organic compound) coordinated to the red quantum dot 22R (first quantum dot).

Additionally, the ring is preferably formed by fewer atoms in the cyclic organic compound 24B (second cyclic organic compound) coordinated to the blue quantum dot 22B (second quantum dot) than in the cyclic organic compound 24G (first cyclic organic compound) coordinated to the green quantum dot 22G (first quantum dot).

According to the structure described above, the shorter the wavelength of the light emitted by a quantum dot in the light-emitting layer 12, the more cyclic organic compounds coordinated to the quantum dot. Generally, the luminous efficiency of the light-emitting element containing quantum dots tends to decrease with a decrease in the wavelength of the light emitted by the quantum dots. Therefore, according to the structure described above, more cyclic organic compounds are coordinated to the quantum dots in a light-emitting element with a low luminous efficiency. Therefore, the luminous efficiency of the quantum dots can be improved.

Specifically, for example, in the present embodiment, the red-quantum-dot luminous body 20R may contain, as the cyclic organic compounds, 16-crown-4 where a ring is formed by 16 atoms. In addition, the green-quantum-dot luminous body 20G may contain, as the cyclic organic compounds, 15-crown-3 where a ring is formed by 15 atoms. Additionally, the blue-quantum-dot luminous body 20B may contain, as the cyclic organic compounds, 12-crown-4 where a ring is formed by 12 atoms.

Besides, for example, in the present embodiment, the red-quantum-dot luminous body 20R may contain, as the cyclic organic compounds, 15-crown-3 where a ring is formed by 15 atoms. Additionally, the green-quantum-dot luminous body 20G may contain, as the cyclic organic compounds, diaza-15-crown-3 where a ring is formed by 15 atoms. In addition, the blue-quantum-dot luminous body 20B may contain, as the cyclic organic compounds, 12-crown-4 where a ring is formed by 12 atoms.

In addition, for the same reasons as above, when the light-emitting layer 12 contains two or more light-emitting layers, the number of the atoms that form the ring of the cyclic organic compound coordinated to each respective quantum dot is preferably adjusted in accordance with the length of the emission wavelength of each quantum dot in each light-emitting layer. Specifically, when the light-emitting layer 12 is a stack of the light-emitting layer 12R (first light-emitting layer) containing the red quantum dots 22R (first quantum dots) and the light-emitting layer 12G (second light-emitting layer) containing the green quantum dots 22G (second quantum dots that have a shorter emission wavelength than the first quantum dots), the ring is preferably formed by fewer atoms in the cyclic organic compounds 24G (second cyclic organic compounds) coordinated to the green quantum dots 22G than in the cyclic organic compounds 24R (first cyclic organic compounds) coordinated to the red quantum dots 22R.

Note that the display device 2 shown in FIG. 1A represents an example of a structure including three types of light-emitting elements that emit mutually different colors of light (the light-emitting element 6R, the light-emitting element 6G, and the light-emitting element 6B), but is not limited to this. According to another embodiment, the display device 2 may include two types of light-emitting elements that emit mutually different colors of light and may include four or more types of light-emitting elements that emit mutually different colors of light.

The present disclosure is not limited to the description of the embodiments above and may be altered within the scope of the claims. Embodiments based on a proper combination of technical means disclosed in different embodiments are encompassed in the technical scope of the present disclosure. Furthermore, new technological features can be created by combining different technical means disclosed in the embodiments.

The invention claimed is:

1. A light-emitting element comprising:

a first electrode;

a second electrode; and a light-emitting layer between the first electrode and the second electrode, wherein the light-emitting layer includes quantum dots and a cyclic organic compound, the cyclic organic compound is configured such that at least some of atoms that form a ring of the cyclic organic compound are coordinated with the quantum dots, or the cyclic organic compound includes cyclic ether, the cyclic ether has a general formula (1)

[Chem. 1]

$$(\text{—}CH_2\text{—}CH_2\text{-}A\text{-})_n \quad (1)$$

where n is an integer from 2 to 8, both inclusive, and each A may be either identical to another A or different from another A and is any of an O, an NH, and an S, and the cyclic organic compound includes π-electrons at a concentration that differs between the at least some of atoms that form the ring of the cyclic organic compound.

2. The light-emitting element according to claim 1, wherein the cyclic organic compound has a $C_8$-$C_{16}$ ring.

3. The light-emitting element according to claim 1, wherein the light-emitting layer contains the cyclic organic compound in an amount from 1 wt % to 50 wt %, both inclusive.

4. The light-emitting element according to claim 3, wherein the light-emitting layer contains the cyclic organic compound in an amount from 5 wt % to 25 wt %, both inclusive.

5. The light-emitting element according to claim 1, wherein the quantum dots include a Group II-V compound or a Group III-V compound.

6. A light-emitting element comprising:

a first electrode;

a second electrode; and a light-emitting layer between the first electrode and the second electrode, wherein the light-emitting layer includes quantum dots and a cyclic organic compound, the cyclic organic compound is configured such that at least some of atoms that form a ring of the cyclic organic compound are coordinated with the quantum dots, or the cyclic organic compound includes cyclic ether, the cyclic ether has a general formula (1)

[Chem. 1]

$$(\text{—}CH_2\text{—}CH_2\text{-A-}) \quad (1)$$

where n is an integer from 2 to 8, both inclusive, and each A may be either identical to another A or different from another A and is any of an O, an NH, and an S, the cyclic organic compound includes a first cyclic organic compound and a second cyclic organic compound that has a ring that is formed by more atoms than is a ring of the first cyclic organic compound, the quantum dots include first quantum dots with which at least some of atoms that form the ring of the first cyclic organic compound are coordinated and second quantum dots with which at least some of atoms that form the ring of the second cyclic organic compound are coordinated, the second quantum dots having a shorter emission wavelength than the first quantum dots, and the light-emitting layer includes a first light-emitting layer including the first quantum dots and a second light-emitting layer including the second quantum dots.

7. A light-emitting device comprising a plurality of light-emitting elements, each of the plurality of light-emitting elements comprising:

a first electrode;

a second electrode; and a light-emitting layer between the first electrode and the second electrode, wherein the light-emitting layer includes quantum dots and a cyclic organic compound, the cyclic organic compound is configured such that at least some of atoms that form a ring of the cyclic organic compound are coordinated with the quantum dots, or the cyclic organic compound includes cyclic ether, the cyclic ether has a general formula (1)

[Chem. 1]

$$(\text{—}CH_2\text{—}CH_2\text{-A-})_n \quad (1)$$

where n is an integer from 2 to 8, both inclusive, and each A may be either identical to another A or different from another A and is any of an O, an NH, and an S, the plurality of light-emitting elements includes a first light-emitting element and a second light-emitting element that differs from the first light-emitting element, a first light-emitting layer, that is the light-emitting layer in the first light-emitting element, includes first quantum dots as the quantum dots and a first cyclic organic compound as the cyclic organic compound, a second light-emitting layer, that is the light-emitting layer in the second light-emitting element, includes second quantum dots as the quantum dots and a second cyclic organic compound as the cyclic organic compound, the second quantum dots have a shorter emission wavelength than the first quantum dots, and a ring of the second cyclic organic compound is formed by fewer atoms than is a ring of the first cyclic organic compound.

* * * * *